(12) United States Patent
Kim

(10) Patent No.: US 6,958,252 B2
(45) Date of Patent: Oct. 25, 2005

(54) FLAT PANEL DISPLAY DEVICE AND METHOD OF MANUFACTURING THE SAME

(75) Inventor: Keum-Nam Kim, Seoul (KR)

(73) Assignee: Samsung SDI Co., Ltd., Suwon-si (KR)

( * ) Notice: Subject to any disclaimer, the term of this patent is extended or adjusted under 35 U.S.C. 154(b) by 423 days.

(21) Appl. No.: 10/038,772

(22) Filed: Jan. 8, 2002

(65) Prior Publication Data

US 2002/0149710 A1  Oct. 17, 2002

(30) Foreign Application Priority Data

Apr. 13, 2001 (KR) ................................ 2001-19915

(51) Int. Cl.⁷ .......................................... H01L 21/283
(52) U.S. Cl. ..................................................... 438/34
(58) Field of Search ............................ 438/26, 29, 30, 438/34, 38, 149, 166, 488, 22, 23, 24; 257/59, 257/60, 72

(56) References Cited

U.S. PATENT DOCUMENTS

| | | | |
|---|---|---|---|
| 5,010,027 A | * | 4/1991 | Possin et al. ............... 438/159 |
| 5,671,027 A | * | 9/1997 | Sasano et al. ................ 349/46 |
| 5,686,326 A | * | 11/1997 | Kitahara et al. ............. 438/155 |
| 5,897,328 A | * | 4/1999 | Yamauchi et al. ............ 438/29 |
| 6,087,730 A | * | 7/2000 | McGarvey et al. ......... 257/766 |
| 6,111,619 A | * | 8/2000 | He et al. ....................... 349/43 |
| 6,346,978 B1 | * | 2/2002 | Hsu et al. .................... 349/160 |
| 6,480,577 B1 | * | 11/2002 | Izumi et al. .................. 379/40 |

FOREIGN PATENT DOCUMENTS

JP  9-318973  12/1997

* cited by examiner

*Primary Examiner*—Craig A. Thompson
*Assistant Examiner*—Jennifer M Dolan
(74) *Attorney, Agent, or Firm*—Stein, McEwen & Bui, LLP

(57) ABSTRACT

A flat panel display includes a pixel electrode having an opening portion formed on an insulating substrate, a semiconductor layer formed over a surface of the insulating substrate, spaced apart from the pixel electrode, having source and drain regions formed to both end portions thereof, a first insulating layer formed over the surface of the insulating substrate excluding the opening portion of the pixel electrode, a gate electrode formed on the first insulating layer over the semiconductor layer, and a second insulating layer formed over the surface of the insulating substrate excluding the opening portion of the pixel electrode. The present invention provides an organic EL display manufactured with reduced mask processes which has excellent electrical characteristics and improved light transmittance.

17 Claims, 8 Drawing Sheets

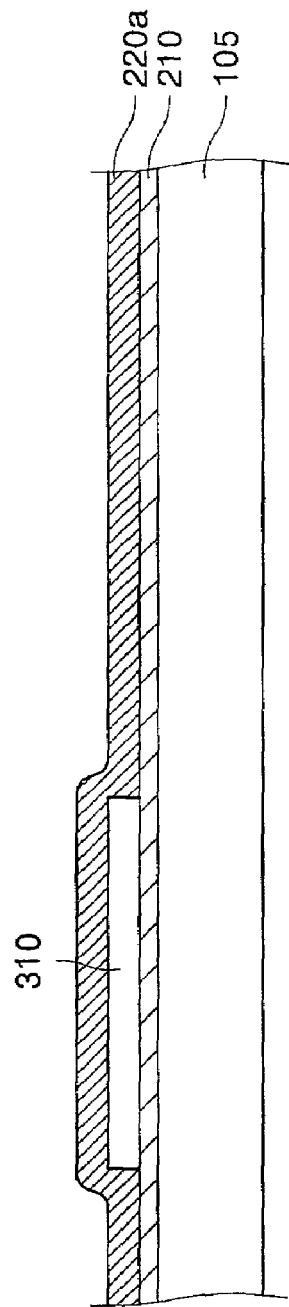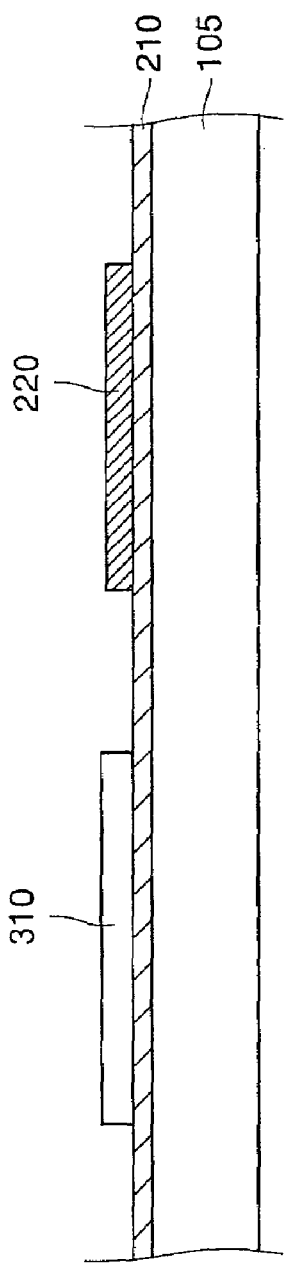

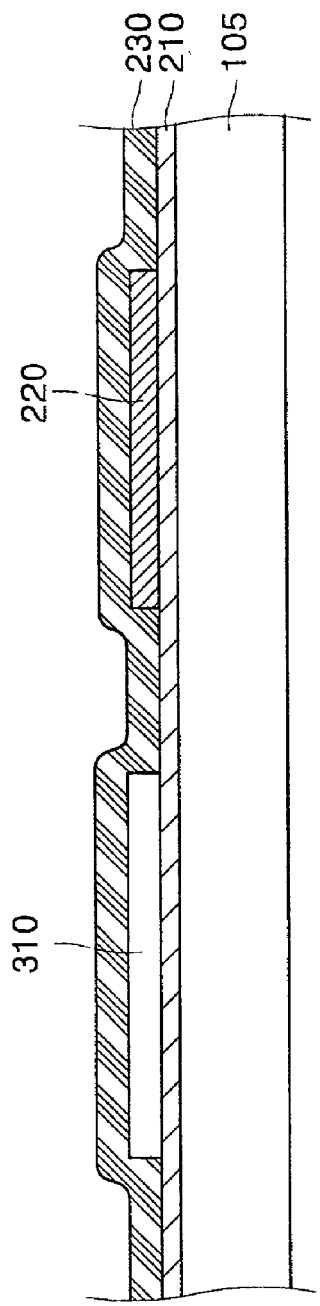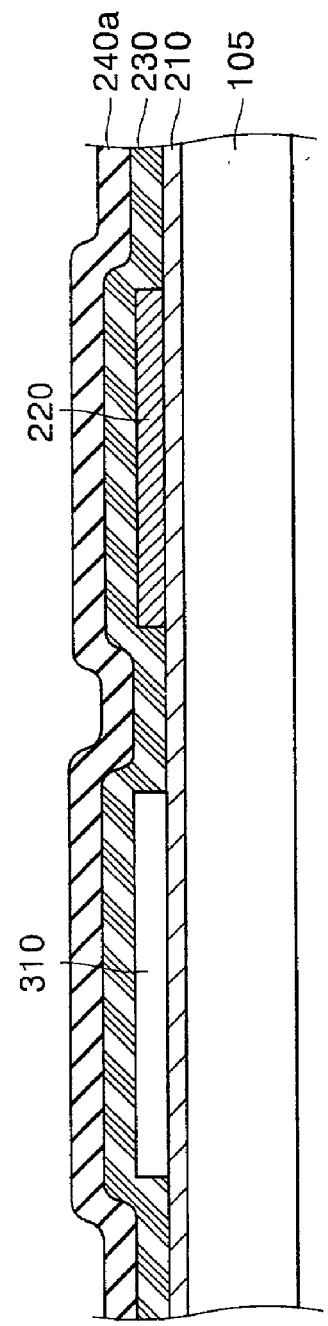

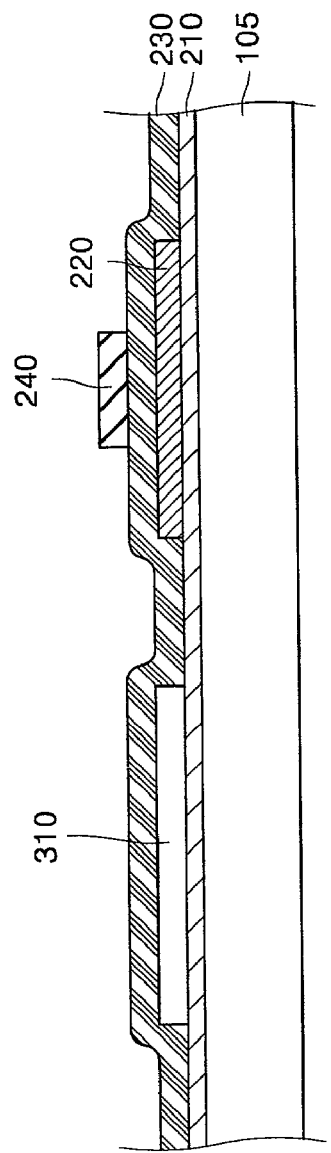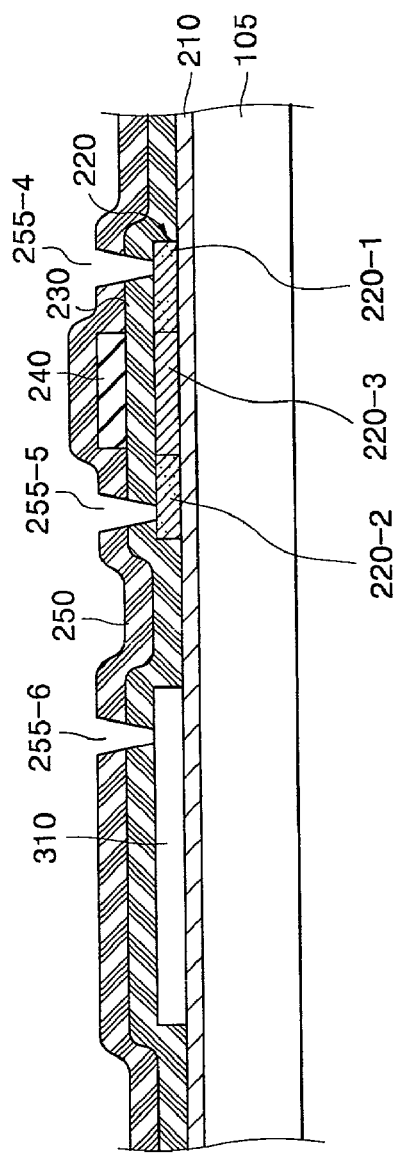

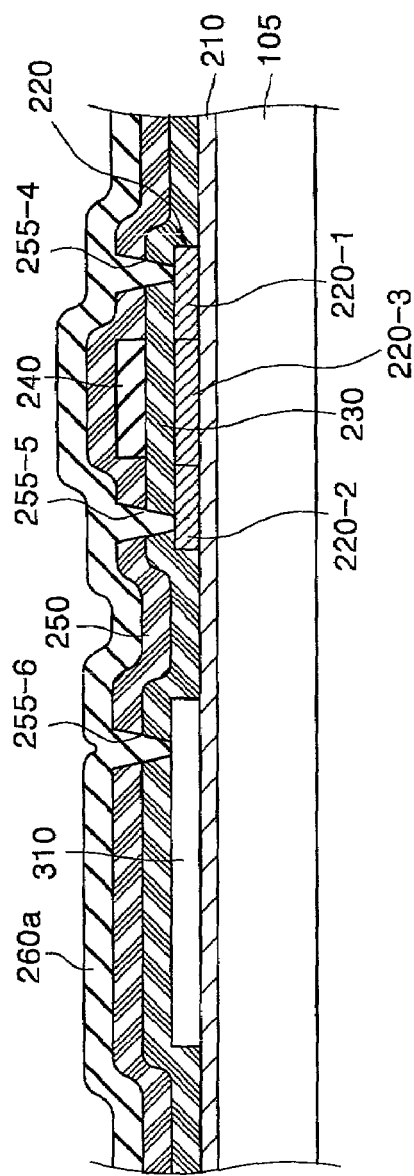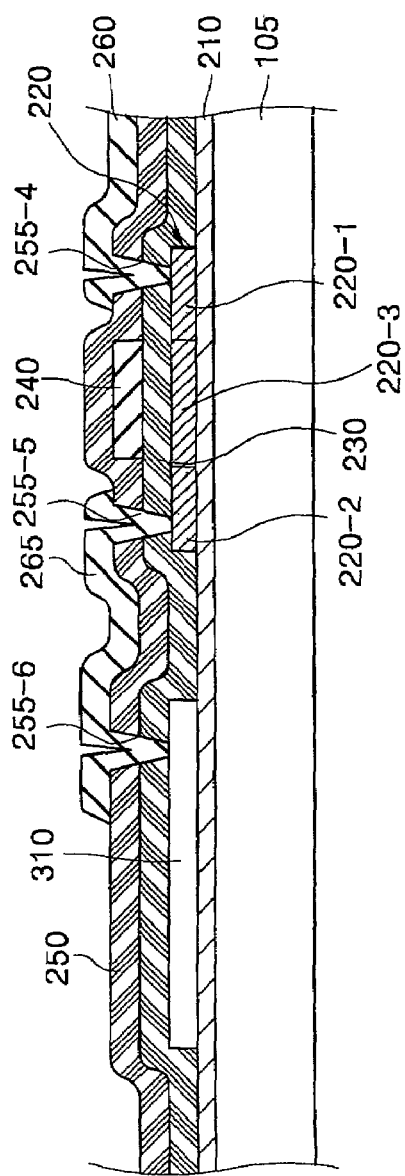

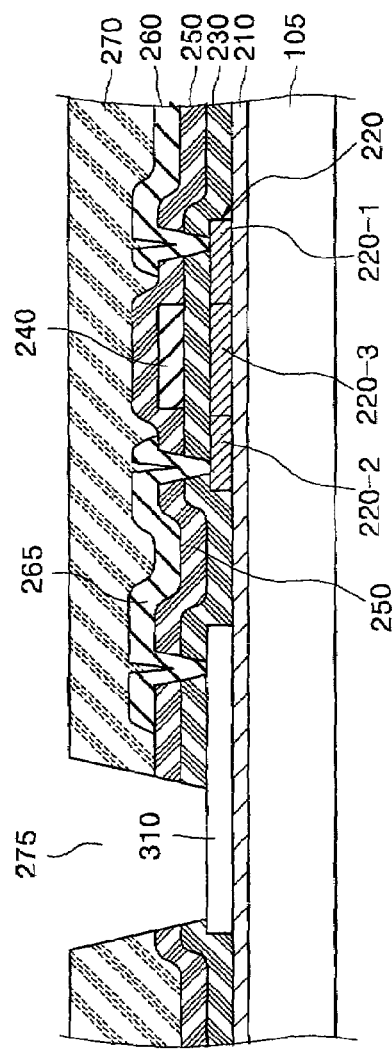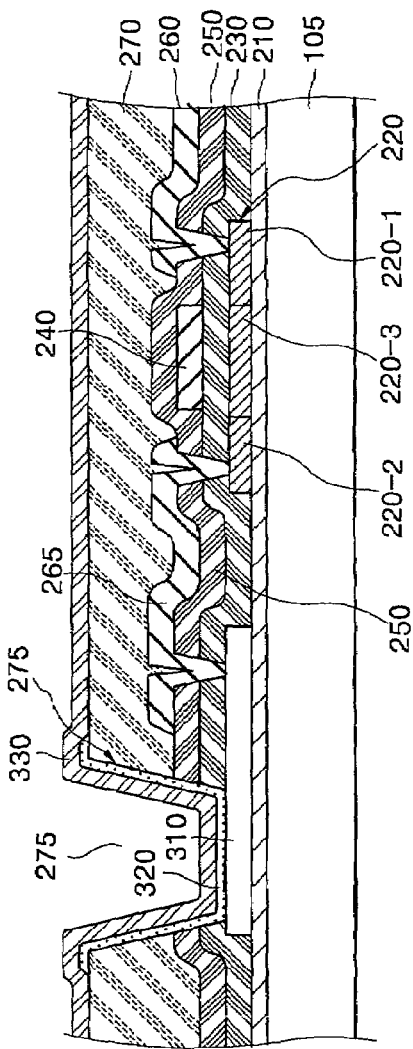

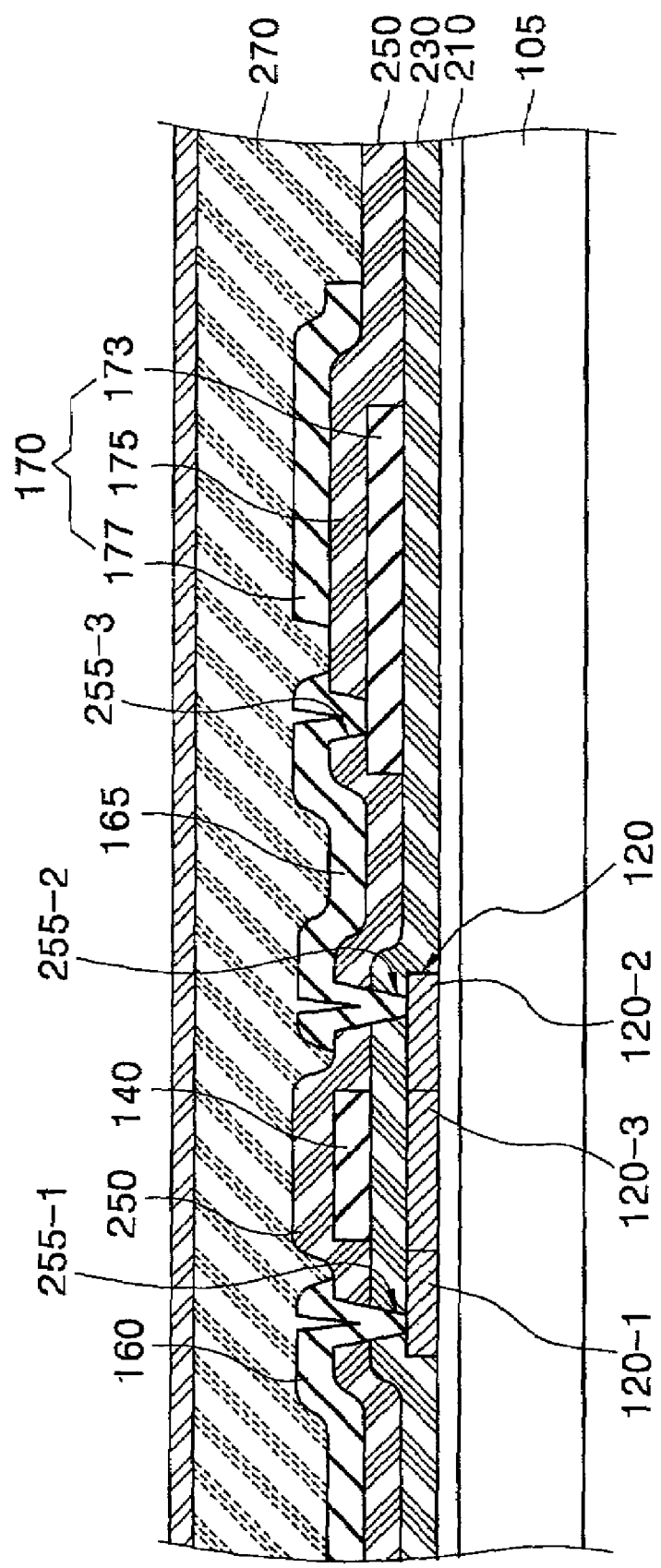

FLAT PANEL DISPLAY DEVICE AND METHOD OF MANUFACTURING THE SAME

CROSS-REFERENCE TO RELATED APPLICATIONS

This application claims the benefit of Korean Patent Application No. 2001-19915, filed on Apr. 13, 2001, in the Korean Industrial Property Office, the disclosure of which is incorporated herein by reference.

BACKGROUND OF THE INVENTION

1. Field of the Invention

The present invention relates to a flat panel display and a method of manufacturing the same. More particularly, the present invention relates to an organic electroluminescence (EL) display and a method of manufacturing the same.

2. Description of the Related Art

Electroluminescence (EL) displays have recently attracted considerable attention as a flat panel display. The EL displays generally use a thin film transistor (TFT) as a switching element.

FIG. 1 is a cross-sectional view illustrating a conventional EL display. The conventional EL display of FIG. 1 is manufactured as follows. First, a first insulating layer 11 is formed on the whole surface of a transparent insulating substrate 10. The first insulating layer 11 serves as a buffer layer. The transparent insulating substrate 10 is made of a glass or a synthetic resin. A polysilicon layer is deposited on the buffer layer 11 and patterned into a semiconductor layer 13 using a first mask.

A second insulating layer 15 is formed over the whole surface of the transparent insulating substrate 10 and covers the semiconductor layer 13. The second insulating layer 15 serves as a gate insulating layer.

A first metal layer is deposited on the first insulating layer 15 and patterned into a gate electrode 16 and a first capacitor electrode 17 using a second mask.

An n-type or a p-type impurity is ion-doped into the semiconductor layer 13 to form source and drain regions 13-1 and 13-2. A portion 13-3 of the semiconductor layer 13 under the gate electrode 16 serves as an active area.

A third insulating layer 19 is formed over the whole surface of the transparent insulating substrate 10 and covers the gate electrode 16 and the first capacitor electrode 17. The insulating layer 19 serves as an inter-insulating layer.

Subsequently, the second and third insulating layers 15 and 19 are etched using a third mask to form first and second contact holes 20-1 and 20-2. The first contact hole 20-1 exposes a portion of the source region 13-1, and the second contact hole 20-2 exposes a portion of the drain region 13-2.

A second metal layer is deposited over the whole surface of substrate and patterned into source and drain electrodes 22-1 and 22-2 and a second capacitor electrode 22-3 using a fourth mask. The source electrode 22-1 contacts the source region 13-1 through the first contact hole 20-1, and the drain electrode 22-2 contacts the drain region 13-2 through the second contact hole 20-2. The second capacitor electrode 22-3 extends from either of the source and drain electrodes 22-1 and 22-2, for example the source electrode 22-1. Consequently, a TFT 51 and a capacitor 52 of the conventional EL display are completed.

At this point, a portion of the third insulating layer 19 between the first and second capacitor electrodes 17 and 22-3 serves as a dielectric layer of the capacitor 52.

Thereafter, a fourth insulating layer 25 is formed over the whole surface of the transparent insulating substrate 10. The fourth insulating layer 25 serves as a passivation layer. The passivation layer 25 is etched to form a via hole 26 at a region corresponding a portion of either of the source and drain electrodes 22-1 and 22-2 using a fifth mask. In FIG. 1, the via hole 26 exposes a portion of the drain electrode 22-2.

A transparent material layer is deposited on the passivation layer 25 and patterned into a pixel electrode 27 using a sixth mask. The pixel electrode 27 is made of a transparent conductive material such as indium tin oxide (ITO) or indium zinc oxide (IZO). The pixel electrode 27 electrically contacts the drain electrode 22-2 through the via hole 26. The pixel electrode 27 is used as an anode electrode.

A fifth insulating layer 28 is formed over the whole surface of the transparent insulating substrate 10. The fifth insulating layer 28 serves as a planarization layer. The planarization layer 28 is etched using a seventh mask to form an opening portion 28-1. The opening portion 28-1 exposes a portion of the anode electrode 27.

An organic EL layer 29 is formed on the exposed portion of the anode electrode 27 and the planarization layer 28. A third metal layer, i.e., a cathode electrode 30 is deposited to cover the whole display area, completing the conventional organic EL display 53.

However, the conventional organic EL display has the following disadvantages. Since seven complicated mask processes are used to manufacture the organic EL display, production cost is high and manufacturing yield is low. Also, during an etching process to form the anode electrode 27, an etching solution can soak into the source and drain electrodes 22-1 and 22-2, whereupon the source and drain electrodes 22-1 and 22-2 can be damaged, thereby deteriorating electrical characteristics of the TFT. Furthermore, light emitted from the organic EL layer 29 is reflected from an interface between the gate insulating layer 15 and the inter-insulating layer 19, and an interface between the inter-insulating layer 19 and the passivation layer 25, thereby lowering a light transmittance.

SUMMARY OF THE INVENTION

To overcome the problems described above, embodiments of the present invention provide an organic EL display having a high manufacturing yield by reducing mask processes.

It is another object of the present invention to provide an organic EL display having excellent electrical characteristics.

It is a still another object of the present invention to provide an organic EL display having a high light transmittance.

Additional objects and advantages of the invention will be set forth in part in the description which follows and, in part, will be obvious from the description, or may be learned by practice of the invention.

To achieve the above and other objects of the present invention, there is provided a flat panel display, comprising a pixel electrode having an opening portion formed on an insulating substrate, a semiconductor layer formed over a surface of the insulating substrate that is spaced apart from the pixel electrode having source and drain regions formed at both end portions of the semiconductor, a first insulating layer formed over the surface of the insulating substrate excluding the opening portion of the pixel electrode, a gate electrode formed on the first insulating layer over the semiconductor layer, and a second insulating layer formed over the surface of the insulating substrate excluding the opening portion of the pixel electrode.

The flat panel display, further comprising contact holes formed in the first and second insulating layers which expose a portion of the pixel electrode and portions of the source and drain regions of the semiconductor layer, source and drain electrodes formed on the second insulating layer, wherein the source electrode is electrically connected to the source region through one of the contact holes, and the drain electrode is electrically connected to the drain region and the pixel electrode through the other of the contact holes, and a third insulating layer formed over the surface of the insulating substrate excluding the opening portion of the pixel electrode.

The opening portion has an area size smaller than the pixel electrode. The third insulating layer is a planarization layer that is made of $SiN_x$, $SiO_x$, acryl or a photoresist layer.

The present invention provides a method of manufacturing a flat panel display, comprising forming a pixel electrode and a semiconductor layer, spaced apart from each other, on an insulating substrate, forming a first insulating layer over a surface of the insulating substrate to cover the pixel electrode and the semiconductor layer, forming a gate electrode on a portion of the first insulating layer corresponding to a location of the semiconductor layer, forming a second insulating layer over the surface of the insulating substrate to cover the gate electrode, forming contact holes in the first and second insulating layers to expose a portion of the pixel electrode and portions of the semiconductor layer, forming source and drain electrodes on the second insulating layer electrically connecting the source electrode to the semiconductor layer through one of the contact holes and electrically connecting the drain electrode to the semiconductor layer and the pixel electrode through the other of the contact holes, forming a photoresist layer over the surface of the insulating substrate exposing a portion of the second insulating layer over the pixel electrode, and forming an opening portion by etching the first and second insulating layers using the photoresist layer as a mask.

When the semiconductor layer and the pixel electrode are formed on the insulating substrate, the pixel electrode is formed after the semiconductor layer. Otherwise, the pixel electrode is formed before the semiconductor layer.

The method further comprising forming a third insulating layer over the surface of the insulating substrate before forming the photoresist layer and removing the remaining photoresist layer after forming the opening portion using the photoresist layer as a mask.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIGS. 3A to 3L are diagrams of cross-sectional views taken along line III—III of FIG. 2 illustrating a method of manufacturing a flat panel display according to an embodiment of the present invention; and FIG. 4 is a diagram illustrating a cross-sectional view of the flat panel display taken along line IV—IV of FIG. 2.

DETAILED DESCRIPTION OF THE PREFERRED EMBODIMENTS

Figure 1:
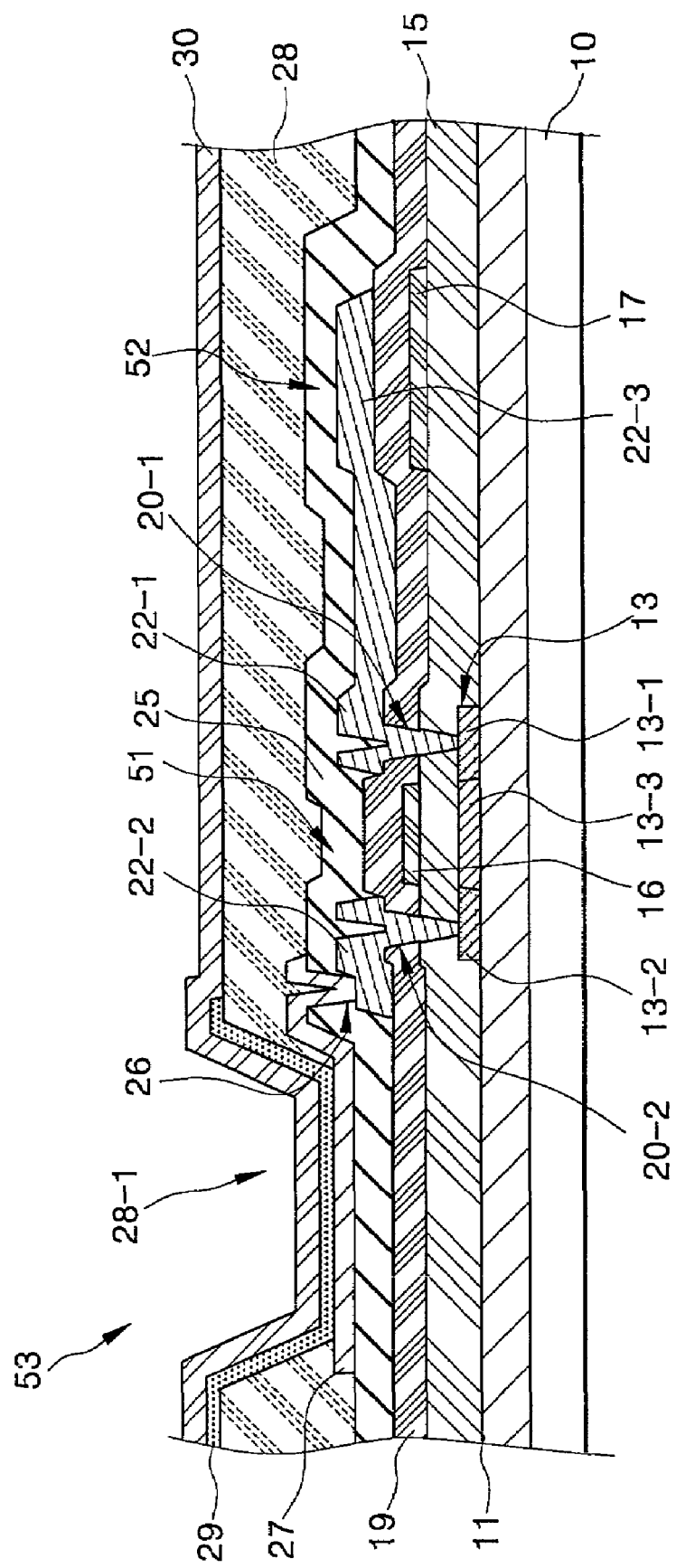
FIG. 1 is a diagram illustrating a cross-sectional view of a conventional EL display.

Reference will now be made in detail to preferred embodiments of the present invention, examples of which are illustrated in the accompanying drawings, wherein like reference numerals refer to the like elements throughout. The embodiments are described below in order to explain the present invention by referring to the figures.

Figure 2:
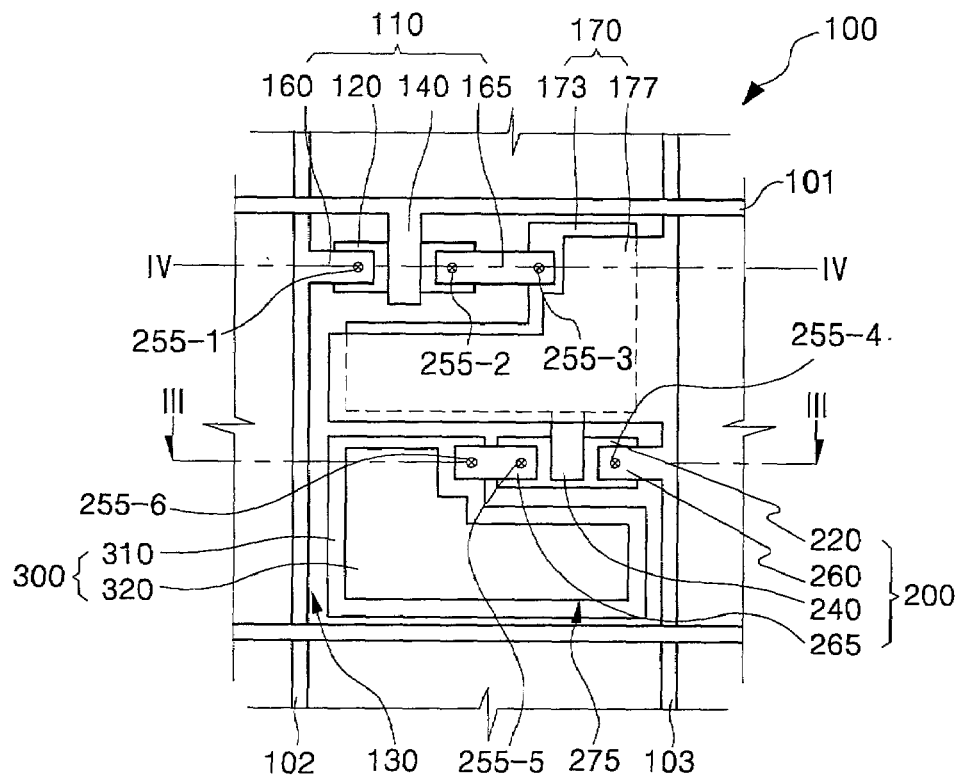
FIG. 2 is a diagram illustrating a plan view of an organic EL display according to an embodiment of the present invention.

FIG. 2 shows a plan view illustrating an organic EL display 100 according to an embodiment of the present invention. Referring to FIG. 2, the organic EL display 100 includes pixels 130, where each pixel 130 includes first and second TFTs 110 and 200, a storage capacitor 170, and an organic EL element 300.

The pixel 130 is formed at a region defined by two adjacent gate lines 101, a data line 102 and a power supplying line 103. The gate lines 101 are arranged in a transverse direction. The data line 102 and the power supplying line 103 are arranged in a perpendicular direction to the gate lines 101. The gate lines 101 serve to apply a thin film transistor (TFT) on/off current. The data line 102 serves to apply a data voltage. The power supplying line 103 serves to supply a current for driving the organic EL display 100.

The first TFT 110 is arranged at a location adjacent to a crossing point of the gate lines 101 and the data line 102. The first TFT 110 includes a semiconductor layer 120, a gate electrode 140, and source and drain electrodes 160 and 165. The semiconductor layer 120 includes source and drain regions 120-1 and 120-2 and an active area 120-3 (see FIG. 4). The gate electrode 140 extends from the gate line 101. The source electrode 160 extends from the data line 102, and is electrically connected to the source region 120-1 of the semiconductor layer 120 through a first contact hole 255-1. The drain electrode 165 is electrically connected to the drain region 120-2 through a second contact hole 255-2.

The storage capacitor 170 serves to store a data voltage required to drive the second TFT 200 during one frame. The storage capacitor 170 includes first and second capacitor electrodes 173 and 177 with a dielectric layer 175 interposed therebetween (see FIG. 4). The first capacitor electrode 173 is electrically connected to the drain electrode 165 of the first TFT 110 through a third contact hole 255-3. The second capacitor electrode 177 extends from the power supplying line 103.

The second TFT 200 includes a semiconductor layer 220, a gate electrode 240, and source and drain electrodes 260 and 265. The semiconductor layer 220 includes source and drain regions 220-1 and 220-2 and an active area 220-3 (see FIG. 3L). The gate electrode 240 extends from the first capacitor electrode 173. The source electrode 260 extends from the power supplying line 103 and is electrically connected to the source region 220-1 of the semiconductor layer 220 through a fourth contact hole 255-4. The drain electrode 265 serves to apply a driving voltage to the organic EL element 300 and is electrically connected to the drain region 220-2 of the semiconductor layer 220 through a fifth contact hole 255-5.

The organic EL element 300 includes an anode electrode 310 and a cathode electrode 330 with an organic EL layer 320 (see FIG. 3L) interposed therebetween. The anode electrode 310 is electrically connected to the drain electrode 265 of the second TFT 200 through a sixth contact hole 255-6. An opening portion 275 is formed on the anode electrode 310, and the organic EL layer 320 is formed on the anode electrode 310 to cover the opening portion 275.

Hereinafter, a process of manufacturing the organic EL display of FIG. 2 is described with reference to FIGS. 3A to 3L and 4. FIGS. 3A to 3L show cross-sectional views taken along line III—III of FIG. 2. FIG. 4 shows a cross-sectional view taken along line IV—IV of FIG. 2.

Figure 3A:
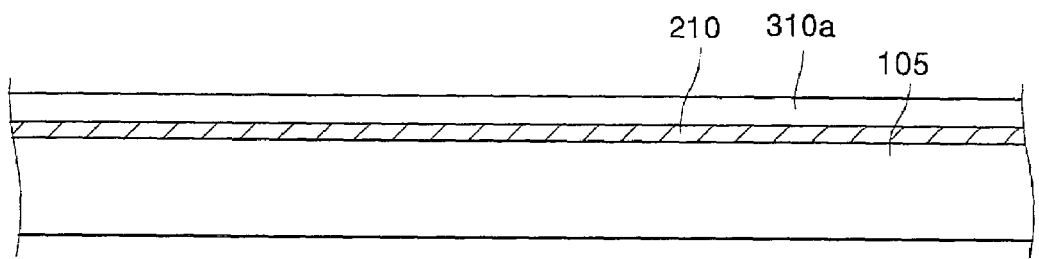

FIG. 3A shows that a first insulating layer 210 is formed on the whole surface of a transparent insulating substrate ("substrate") 105 as a buffer layer. The buffer layer 210 serves to prevent an influx of an impurity. A transparent conductive material layer 310a is deposited on the buffer layer 210.

Figure 3B:
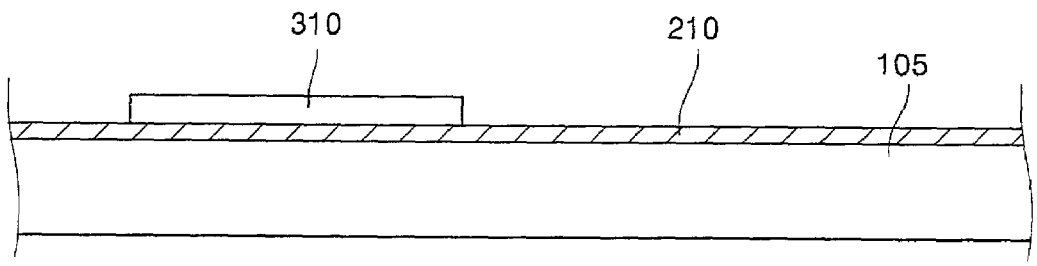

FIG. 3B shows that the transparent conductive material layer 310a is patterned into an anode electrode, i.e., a pixel electrode 310 using a first mask.

FIG. 3C shows that a polysilicon layer 220a is deposited over the whole surface of the substrate 105 to cover the anode electrode 310. At this point, according to an embodiment of the invention, the polysilicon layer 220a is formed such that an amorphous silicon layer is deposited and then annealed. However, the amorphous silicon layer need not be deposited in all circumstances.

Referring to FIGS. 3D and 4, the polysilicon layer 220a is patterned using a second mask to form the semiconductor layers 120 and 220. In this embodiment, when the pixel electrode 310 and the semiconductor layers 120 and 220 are formed on the substrate 105, the pixel electrode 310 is formed and then the semiconductor layers 120 and 220 are formed. Otherwise, the semiconductor layers 120 and 220 are formed and then the pixel electrode 310 is formed.

Subsequently, FIGS. 3E and 4 show that a second insulating layer 230 is formed over the whole surface of the substrate 105 and covers the semiconductor layers 120 and 220. The second insulating layer 230 serves as a gate insulating layer.

FIGS. 3F and 4 show that a first metal layer 240a is deposited on the second insulating layer 230. FIGS. 3G and 4 show that the first metal layer 240a is patterned into the gate electrodes 140 and 240 and the first capacitor electrode 173 using a third mask.

FIGS. 3H and 4 show that an n-type or a p-type impurity is ion-doped into the semiconductor layers 120 and 220 to form the source and drain regions 120-1 and 120-2, and 220-1 and 220-2, respectively. Portions 120-3 and 220-3 of the semiconductor layers 120 and 220 under the gate electrodes 140 and 240 serve as an active area, respectively.

A third insulating layer 250 is formed over the whole surface of the substrate 105 and covers the gate electrodes 140 and 240. The third insulating layer 250 serves as an inter-insulating layer. A portion of the inter-insulating layer 250 corresponding to the first capacitor electrode 173 serves as the dielectric layer 175 of the storage capacitor 170. The gate insulating layer 230 and the inter-insulating layer 250 are etched using a fourth mask to form first to sixth contact holes, 255-1 to 255-6.

Thereafter, FIGS. 3I and 4 show that a second metal layer 260a is deposited on the inter-insulating layer 250.

FIGS. 3J and 4 show that the second metal layer 260a is patterned using a fifth mask to form the source and drain electrodes 160 and 165 of the first TFT 110, the source and drain electrodes 260 and 265 of the second TFT 200 and the second capacitor electrode 177.

The source electrode 160 is electrically connected to the source region 120-1 through the first contact hole 255-1. One end of the drain electrode 165 is electrically connected to the drain region 120-2 through the second contact hole 255-2, and the other end is electrically connected to the first capacitor electrode 173 through the third contact hole 255-3.

The source electrode 260 is electrically connected to the source region 220-1 through the fourth contact hole 255-4. One end of the drain electrode 265 is electrically connected to the drain region 220-2 through the fifth contact hole 255-5, and the other end is electrically connected to the anode electrode 310 through the sixth contact hole 255-6.

Subsequently, FIGS. 3K and 4 show that a fourth insulating layer 270 is formed over the whole surface of the substrate 105 as a planarization layer. The planarization layer 270 is etched using a sixth mask to expose a portion of the anode electrode 310, thereby forming an opening portion 275 on the anode electrode 310. The opening portion 275 has an area size smaller than the anode electrode 310 50 that the organic EL layer 330 is deposited not to be tangent to an edge portion of the anode electrode 310. When the organic EL layer 330 is tangent to the edge portion of the anode electrode 310, a strong electric field is generated at the edge portion of the anode electrode 310, thereby shortening a life span of the organic EL display.

The first to third insulating layers are made of, for example, $SiN_x$ or $SiO_x$, and the fourth insulating layer is made of, for example, $SiN_x$, $SiO_x$ or acryl.

In this embodiment of the present invention, the opening portion 275 is formed according to the following method. First, the planarization layer 270 is formed on the inter-insulating layer 250, and then a photoresist pattern is formed on the planarization layer 270. The planarization layer 270 is made of $SiN_x$ or $SiO_x$. The gate insulating layer 230, the inter-insulating layer 250 and the planarization layer 270 are simultaneously etched according to the photoresist pattern to form the opening portion 275. The remaining photoresist pattern is removed. Alternatively, the opening portion 275 can be formed such that a photoresist pattern is formed on the inter-insulating layer 250, and then the gate insulating layer 230 and the inter-insulating layer 250 are simultaneously etched according to the photoresist pattern, wherein the photoresist pattern is used as the planarization layer. Since a process to form the passivation layer can be omitted or the photoresist pattern can substitute the planarization layer, the manufacturing process can be further simplified.

Subsequently, FIGS. 3L and 4 show that the organic EL layer 320 is formed on the exposed portion of the anode electrode 310. Finally, a third metal layer 330 is formed on the planarization layer 270 to cover the organic EL layer 320. The third metal layer 330 is used as a cathode electrode.

Even though not shown, the organic EL layer 320 generally includes a hole transport layer, a luminescent layer, and an electron transport layer that are laminated in sequence and are sandwiched between the anode electrode and the cathode electrode.

The gate lines 101 (see FIG. 2) are formed at the same time as the gate electrodes 140 and 240, and the data line 102 and the power supplying line 103 (see FIG. 2) are formed at the same time as the source and drain electrodes 160 and 165, and 260 and 265.

As described above, the organic EL display according to an embodiment of the present invention is manufactured using six mask processes compared to the conventional process that uses 7 mask processes. The reduction of the masking process in the present invention increases the overall manufacturing yield. Furthermore, since the insulating layers are not arranged at a region corresponding to the organic EL layer 320, a light transmittance can be significantly improved. In addition, since the pixel electrode 310 is formed before a process to form the source and drain electrodes 260 and 265, it is possible to prevent the source and drain electrodes from being damaged by an etch process (if the pixel electrode 310 is formed after the source and drain electrodes), thereby improving electric characteristics of the TFT.

The present invention is described with a focus on an organic EL display. However, the present invention can be applied to other flat panel displays such as a liquid crystal display (LCD).

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of manufacturing a flat panel display, comprising:
    forming a pixel electrode and a semiconductor layer, spaced apart from each other, on a substrate;
    forming a first insulating layer over a surface of the substrate to cover the pixel electrode and the semiconductor layer;
    forming a gate electrode on a portion of the first insulating layer corresponding to a location of the semiconductor layer;
    forming a second insulating layer over the surface of the substrate to cover the gate electrode;
    forming contact holes in the first and second insulating layers to expose a portion of the pixel electrode and portions of the semiconductor layer;
    forming source and drain electrodes on the second insulating layer electrically connecting the source electrode to the semiconductor layer through one of the contact holes, and electrically connecting the drain electrodes to the semiconductor layer and the pixel electrode through another one of the contact holes;
    forming a photoresist layer over the surface of the substrate exposing a portion of the second insulating layer over the pixel electrode;
    forming an opening portion by etching the first and second insulating layers to expose a portion of the pixel electrode, using the photoresist layer as a mask;
    forming an electroluminescence (EL) layer on the exposed portion of the pixel electrode; and
    forming a cathode over the EL layer and the photoresist layer.

2. The method of claim 1, wherein said forming of the pixel electrode and the semiconductor layer comprises forming the pixel electrode after forming the semiconductor layer.

3. The method of claim 1, wherein said forming of the pixel electrode and the semiconductor layer comprises forming the pixel electrode before forming the semiconductor layer.

4. The method of claim 1, wherein said forming of the semiconductor layer comprises:
    depositing an amorphous silicon layer on the substrate;
    annealing the amorphous silicon layer to form a polysilicon layer; and
    patterning the polysilicon layer to form the semiconductor layer.

5. The method of claim 1, wherein said forming of the semiconductor layer further comprises:
    forming a polysilicon layer on the substrate; and
    patterning the polysilicon layer to form the semiconductor layer.

6. The method of claim 5, wherein said forming of the gate electrode comprises:
    depositing a first metal layer on the first insulating layer; and
    patterning the first metal layer to form the gate electrode.

7. The method of claim 6, further comprising forming source and drain regions at corresponding end portions of the semiconductor layer.

8. The method of claim 7, wherein said forming of the source and drain electrodes comprises:
    depositing a second metal layer on the second insulating layer; and
    patterning the second metal layer to form the source and drain electrodes.

9. The method of claim 8, wherein said forming of the opening portion comprises using the remaining photoresist layer as a planarization layer.

10. The method of claim 9, wherein said forming of the pixel electrode and the semiconductor layer comprises forming the pixel electrode after forming the semiconductor layer.

11. The method of claim 9, wherein said forming of the pixel electrode and the semiconductor layer comprises forming the pixel electrode before forming the semiconductor layer.

12. The method of claim 8, further comprising:
    forming a third insulating layer over the surface of the substrate before the forming of the photoresist layer; and
    removing the remaining photoresist layer after the forming of the opening portion using the photoresist layer as a mask.

13. The method of claim 12, wherein the third insulating layer comprises one of an oxide layer, a nitride layer and an acryl layer.

14. The method of claim 1, wherein said forming of the opening portion comprises using the remaining photoresist layer as a planarization layer.

15. The method of claim 1, further comprising:
    forming a third insulating layer over the surface of the substrate before the forming of the photoresist layer; and
    removing the remaining photoresist layer after the forming of the opening portion using the photoresist layer as a mask.

16. The method of claim 1, further comprising:
    forming the opening portion in the first and second insulating layers to have an area size smaller than the pixel electrode so that the EL layer does not have a surface with a tangent to an edge portion of the pixel electrode.

17. A method of manufacturing a flat panel display, comprising:
    forming a thin film transistor and a pixel electrode on a buffered substrate, the pixel electrode being covered by one or more insulating layers during the formation of the thin film transistor;
    etching an opening in the one or more layers to expose a portion of the pixel electrode;
    forming an electroluminescence (EL) layer on the pixel electrode and in the opening; and
    forming a cathode over the EL layer.

* * * * *